(12) United States Patent
Wilkerson et al.

(10) Patent No.: US 11,855,061 B2
(45) Date of Patent: Dec. 26, 2023

(54) OFFSET-ALIGNED THREE-DIMENSIONAL INTEGRATED CIRCUIT

(71) Applicant: Advanced Micro Devices, Inc., Santa Clara, CA (US)

(72) Inventors: Brett P. Wilkerson, Austin, TX (US); Milind S. Bhagavat, Cupertino, CA (US); Rahul Agarwal, San Francisco, CA (US); Dmitri Yudanov, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/891,444

(22) Filed: Aug. 19, 2022

(65) Prior Publication Data

US 2022/0392882 A1 Dec. 8, 2022

Related U.S. Application Data

(62) Division of application No. 16/799,243, filed on Feb. 24, 2020, now Pat. No. 11,437,359, which is a
(Continued)

(51) Int. Cl.
*H01L 25/18* (2023.01)
*H01L 23/367* (2006.01)
(Continued)

(52) U.S. Cl.
CPC .......... *H01L 25/18* (2013.01); *H01L 23/3675* (2013.01); *H01L 23/481* (2013.01);
(Continued)

(58) Field of Classification Search
CPC ....... H01L 25/0652; H01L 2225/06589; H01L 25/062; H01L 2225/06562; H01L 23/367; G06F 1/206
See application file for complete search history.

(56) References Cited

U.S. PATENT DOCUMENTS

2009/0224400 A1\* 9/2009 Rahman .............. H01L 25/0652
257/E23.101
2013/0119527 A1\* 5/2013 Luo ..................... H01L 25/0657
165/185
(Continued)

OTHER PUBLICATIONS

Ayala, J., et al., "Through Silicon Via-Based Grid for Thermal Control in 3D Chips," International Conference on Nano-Networks, pp. 90-98, Oct. 2009.
(Continued)

*Primary Examiner* — Alia Sabur
(74) *Attorney, Agent, or Firm* — Zagorin Cave LLP

(57) ABSTRACT

A three-dimensional integrated circuit includes a first die structure having a first geometry. The first die structure includes a first region that operates with a first power density and a second region that operates with a second power density. The first power density is less than the second power density. The three-dimensional integrated circuit includes a second die structure having a second geometry. A stacked portion of the second die structure is aligned with the first region. The three-dimensional integrated circuit includes an additional die structure stacked with the first die structure and the second die structure. The additional die structure has the first geometry or the second geometry.

20 Claims, 7 Drawing Sheets

Related U.S. Application Data division of application No. 15/958,169, filed on Apr. 20, 2018, now Pat. No. 10,573,630.

(51) Int. Cl.
  *H01L 23/00* (2006.01)
  *H01L 25/00* (2006.01)
  *H01L 23/48* (2006.01)

(52) U.S. Cl.
  CPC .............. *H01L 24/05* (2013.01); *H01L 24/06* (2013.01); *H01L 24/08* (2013.01); *H01L 24/09* (2013.01); *H01L 25/50* (2013.01); H01L 24/03 (2013.01); H01L 2224/03002 (2013.01); H01L 2224/0557 (2013.01); H01L 2224/06179 (2013.01); H01L 2224/06181 (2013.01); H01L 2224/08146 (2013.01); H01L 2224/09179 (2013.01); H01L 2924/1431 (2013.01); H01L 2924/1433 (2013.01); H01L 2924/1434 (2013.01)

(56) References Cited

U.S. PATENT DOCUMENTS

| | | | | |
|---|---|---|---|---|
| 2014/0059325 | A1* | 2/2014 | Morimoto | G06F 12/0893 712/42 |
| 2014/0070422 | A1 | 3/2014 | Hsiao et al. | |
| 2014/0140008 | A1* | 5/2014 | Yamaguchi | H01L 23/3738 156/308.2 |
| 2015/0048522 | A1* | 2/2015 | Park | H01L 23/16 257/777 |
| 2015/0091179 | A1 | 4/2015 | Shenoy et al. | |
| 2015/0200154 | A1 | 7/2015 | Choi et al. | |
| 2015/0279431 | A1* | 10/2015 | Li | H01L 25/0657 438/109 |
| 2016/0276307 | A1 | 9/2016 | Lin | |
| 2016/0329271 | A1 | 11/2016 | Katti et al. | |
| 2017/0018476 | A1 | 1/2017 | Wang et al. | |
| 2019/0006263 | A1 | 1/2019 | Yu et al. | |

OTHER PUBLICATIONS

Brunschwiler, T., et al., "Forced Convective Interlayer Cooling in Vertically Integrated Packages," Thermal and Thermomechanical Phenomena in Electronic Systems, 2008, 11th Intersociety Conference, pp. 1114-1125.

Colgan, E., et al., "A Practical Implementation of Silicon Microchannel Coolers for High Power Chips," IEEE Transactions on Components and Packaging Technologies, vol. 30, No. 2, Jun. 2007, pp. 218-225.

Go, David, et al., "Ionic winds for locally enhanced cooling," Journal of Applied Physics 102, 2007, 9 pages.

Hsieh, C., et al., "Synthesis and characterization of nitrogen-doped graphene nanosheets/copper composite film for thermal dissipation," Carbon 118, 2017, pp. 1-7.

Huang, S.Y., et al., "Enhanced Reduction of Graphene Oxide on Recyclable Cu Foils to Fabricate Graphene Films with Superior Thermal Conductivity," Scientific Reports, Jun. 2015, pp. 1-11.

Jewell-Larsen, N.E., et al., "Electrohydrodynamic (EHD) Cooled Laptop," 25th IEEE Semi-Therm Symposium, 2009, pp. 261-266.

Jiang, L., et al., "Closed-Loop Electroosmotic Microchannel Cooling System for VLSI Circuits," IEEE Transactions on Components and Packaging Technologies, vol. 25, No. 3, Sep. 2002, pp. 347-355.

Kim, Y.S., "A Robust Wafer Thinning down to 2.6μm for Bumpless Interconnects and DRAM WOW Applications," IEEE International Electron Devices Meeting (IEDM), 2015, pp. 8.3.1-8.3.4.

Koo, J., "Integrated Microchannel Cooling for Three-Dimensional Electronic Circuit Architectures," Journal of Heat Transfer, Jan. 2005, vol. 127, pp. 49-58.

Lee, H., et al., "Thermal Characterization of High Performance MCP with Silicon Spacer Having Low Thermal Impedance," 21st IEEE Semi-Therm Symposium, 2005, 5 pages.

Motoyoshi, M., "Through-Silicon Via (TSV)," Proceedings of the IEEE, vol. 97, No. 1, Jan. 2009, pp. 43-48.

Ongkodjojo, A., et al., "Design, Modeling, and Optimization for Highly Efficient Ionic Wind-Based Cooling Microfabricated Devices," Proceedings of the ASME 2010 International Mechanical Engineering Congress & Exposition, Nov. 12-18, 2010, pp. 1-10.

Sekar, D., et al., "A 3D-IC Technology with Integrated Microchannel Cooling," IEEE Interconnect Technology Conference, 2008, pp. 13-15.

Singhal, V., et al., "Microscale pumping technologies for microchannel cooling systems," Purdue University, Purdue e-Pubs, Birck and NCN Publications, May 2004, pp. 191-221.

Sridhar, A., et al., "Compact Transient Thermal Model for 3D ICs with Liquid Cooling via Enhanced Heat Transfer Cavity Geometries," EDA Publishing, Thermal Investigations of ICs and Systems (THERMINIC) 2010, pp. 1-6.

Wang, E., et al., "Micromachined Jets for Liquid Impingement Cooling of VLSI Chips," Journal of Microelectromechanical Systems, vol. 13, No. 5, Oct. 2004, pp. 833-842.

Wikipedia, "High Bandwidth Memory," downloaded from https://en.wikipedia.org/w/index.php?title=High_Bandwidth_Memory&oldid=802392071, Oct. 27, 2017, 5 pages.

* cited by examiner

OFFSET-ALIGNED THREE-DIMENSIONAL INTEGRATED CIRCUIT

CROSS-REFERENCE TO RELATED APPLICATIONS

This application is a divisional of U.S. patent application Ser. No. 16/799,243, filed on Feb. 24, 2020, entitled "Offset-Aligned Three-Dimensional Integrated Circuit," naming Brett P. Wilkerson, Milind S. Bhagavat, Rahul Agarwal, and Dmitri Yudanov as inventors, which is a divisional of Ser. No. 15/958,169, filed on Apr. 20, 2018, entitled "Offset-Aligned Three-Dimensional Integrated Circuit," naming Brett P. Wilkerson, Milind Bhagavat, Rahul Agarwal, and Dmitri Yudanov as inventors, which applications are incorporated herein by reference in their entirety.

STATEMENT REGARDING FEDERALLY SPONSORED RESEARCH OR DEVELOPMENT

This invention was made with Government support under the PathForward Project with Lawrence Livermore National Security (Prime Contract No. DE-AC52-07NA27344, Subcontract No. B620717) awarded by DOE. The Government has certain rights in this invention.

BACKGROUND

Description of the Related Art

In general, a three-dimensional integrated circuit product includes integrated circuit die that are stacked and interconnected vertically to behave as a single integrated circuit. Three-dimensional integrated circuits achieve performance improvements at reduced power and smaller footprints than conventional two-dimensional integrated circuit products. In operation, heat accumulates within the stack of the integrated circuit die. That heat must be dissipated to reduce or eliminate thermal failure of the three-dimensional integrated circuit product. Traditional heat extraction techniques that extract heat from the top of a stack are insufficient to dissipate enough heat from increasingly dense stacks of integrated circuit die to prevent failure of three-dimensional integrated circuit products. Accordingly, improved techniques for thermal management in three-dimensional integrated circuit products are desired.

SUMMARY OF EMBODIMENTS OF THE INVENTION

In at least one embodiment, a three-dimensional integrated circuit includes a first die structure having a first geometry. The first die structure includes a first region that operates with a first power density and a second region that operates with a second power density. The first power density is less than the second power density. The three-dimensional integrated circuit includes a second die structure having a second geometry. A stacked portion of the second die structure is aligned with the first region. The three-dimensional integrated circuit includes an additional die structure stacked with the first die structure and the second die structure. The additional die structure has the first geometry or the second geometry. If the additional die structure has the first geometry, the additional die structure includes a third region that operates with a third power density and a fourth region that operates with a fourth power density, the third power density is less than the fourth power density, the second die structure is interleaved between the first die structure and the additional die structure, the stacked portion of the second die structure is aligned with the third region, and an overhang portion of the additional die structure extends beyond a periphery of the second die structure. If the additional die structure has the second geometry, the first die structure is interleaved between the second die structure and the additional die structure, a stacked portion of the additional die structure is aligned with the first region, and the overhang portion of the first die structure extends beyond a periphery of the additional die structure. The overhang portion of the first die structure extends beyond the periphery of the second die structure.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
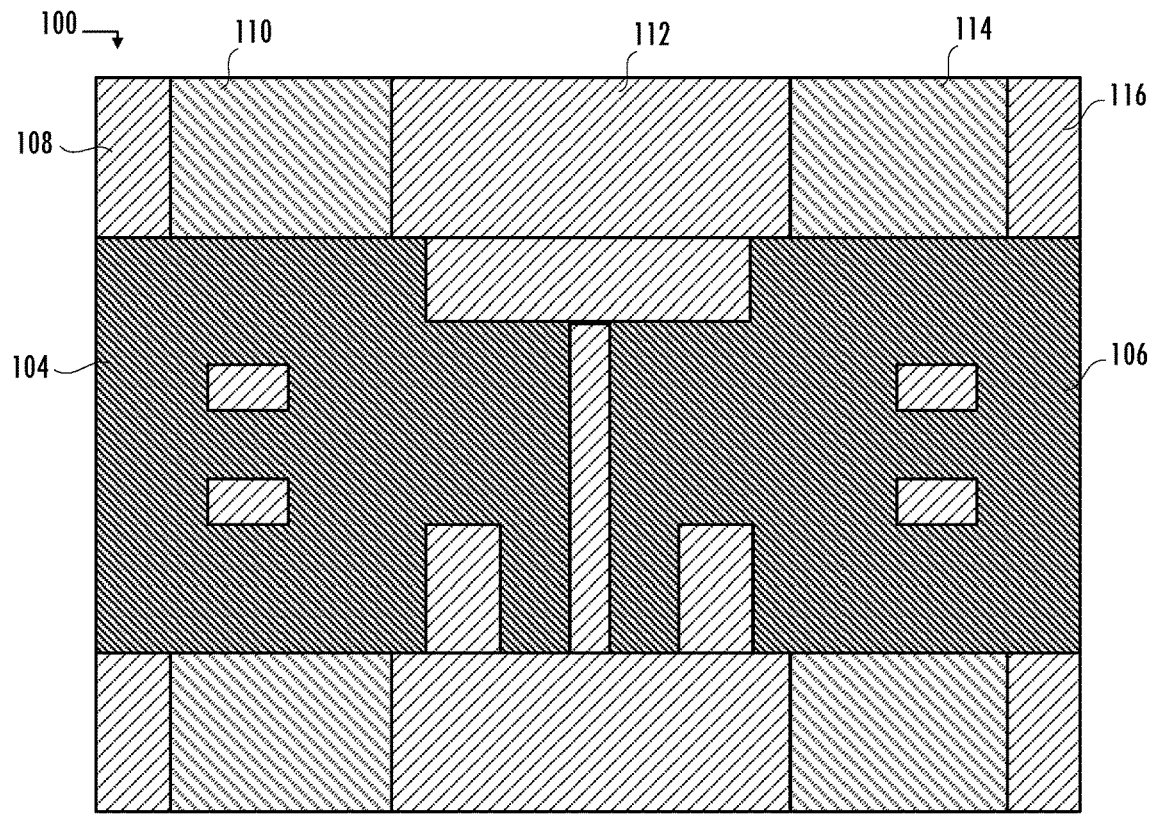
FIG. 1 illustrates an exemplary power density map of a processor die in operation.
Figure 2:
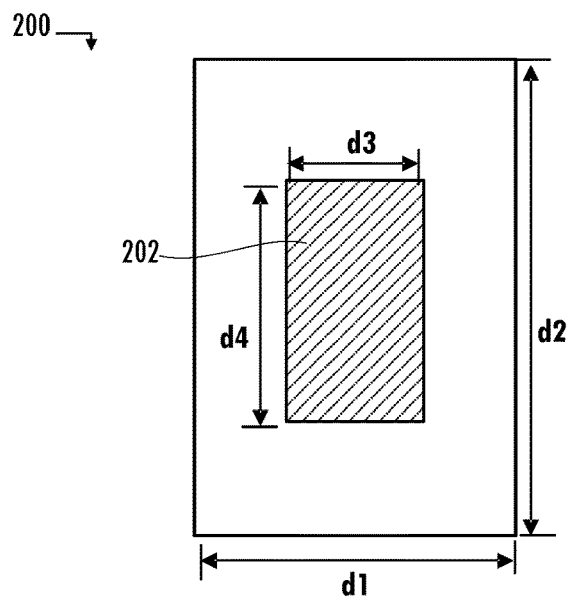
FIG. 2 illustrates an exemplary geometry of a memory module.

Referring to FIG. 1, processor die 100 (e.g., graphics processing unit, central processing unit, digital signal processing unit, or other processing unit) includes regions that operate with different power densities. For example, region 104 and region 106 of processor die 100 operate with a first power density and region 108, region 110, region 112, region 114, region 116 and other similarly shaded regions of processor die 100 operate with second power densities, which are lower than the first power density. Processor die 100 has a first geometry that has substantially larger area than the geometry of each of a plurality of memory modules that will be coupled to processor die 100. Referring to FIGS. 1 and 2, memory module 200 is a stacked memory module (e.g., high-bandwidth memory, which includes multiple stacked memory die coupled to each other and at least partially encapsulated by a mold compound) having an area of d1×d2, which in some embodiments is less than 25% of the area of processor die 100. Memory module 200 includes electrical contacts 202 (e.g., a region including conductive pillars, conductive bumps, or other interconnects of copper, gold, aluminum, other conductive material, or combination thereof) in an area d3×d4. A perimeter zone without electrical contacts located outside region 202 provides a high thermal resistance path to processor die 100 when memory module 200 is stacked on processor die 100.

Figure 3:
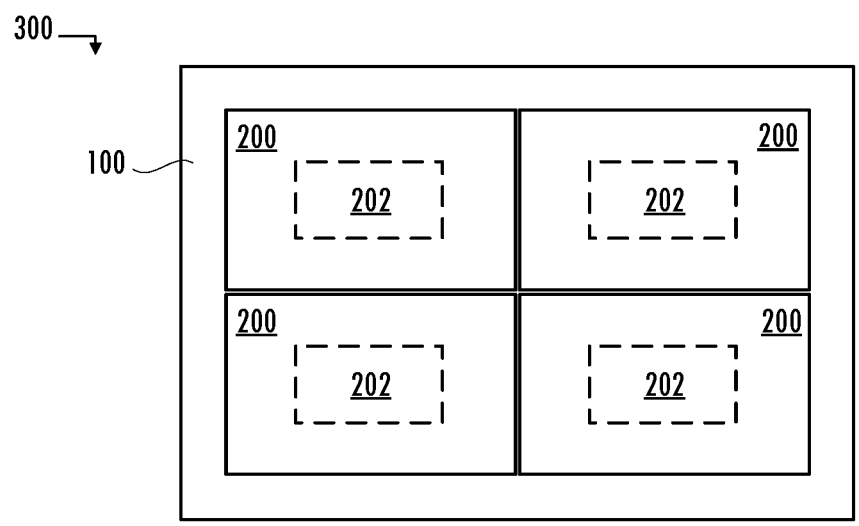
FIG. 3 illustrates a plan view of an exemplary center-aligned configuration for integration of a processor die and multiple memory modules disposed laterally from each other on the processor die in a three-dimensional integrated circuit.

Referring to FIG. 3, in an exemplary three-dimensional integrated circuit, memory modules 200 are stacked on processor die 100 in a conventional configuration, which causes the power dense regions toward the center of processor die 100 to be disposed directly under memory modules 200, resulting in high thermal resistance paths for dissipating the heat generated by processor die 100. That high thermal resistance of memory modules 200 is exacerbated by embodiments of memory modules 200 having limited footprints (e.g., limited electrical contact footprints of approximately 21% of area of memory modules 200), reducing the metal-volume fraction, and thus, further increasing thermal resistance of memory module 200. For example, one or more (e.g., four) memory modules 200 are stacked on processor die 100 laterally with respect to each other memory module 200. Each memory module 200 is coupled to processor die 100 using electrical contacts 202. Underfill material (e.g., epoxy, which is a poor thermal conductor) fills in gaps between memory modules 200 and processor die 100. Mold material encapsulates portions of the stack. The center-alignment of memory modules 200 on processor die 100 may result in a high percentage (e.g., approximately 86%) of dense power blocks of processor die 100 in contact with a high thermal resistance path.

Figure 4:
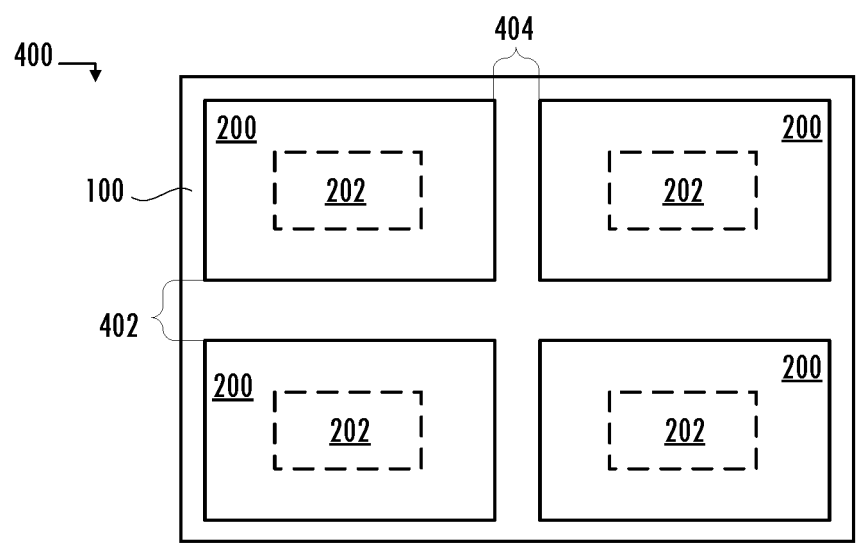
FIG. 4 illustrates a plan view of an exemplary perimeter-aligned configuration for integration of the processor die and multiple memory modules disposed laterally from each other on the processor die in a three-dimensional integrated circuit.

Referring to FIG. 4, an alternate arrangement of a three-dimensional integrated circuit includes memory modules 200 aligned with the perimeter of processor die 100. Accordingly, lanes 402 and lanes 404 between memory modules 200 have increased width, as compared to the center-aligned configuration of FIG. 3. Referring to FIG. 4, underfill material fills in gaps between adjacent memory modules 200 and between memory modules 200 and processor die 100. Mold material encapsulates portions of the stack. The perimeter-aligned arrangement slightly reduces the percentage (e.g., by approximately 4-5%, to approximately 82%) of dense power blocks of processor die 100 in contact with a high thermal resistance path.

Figure 5:
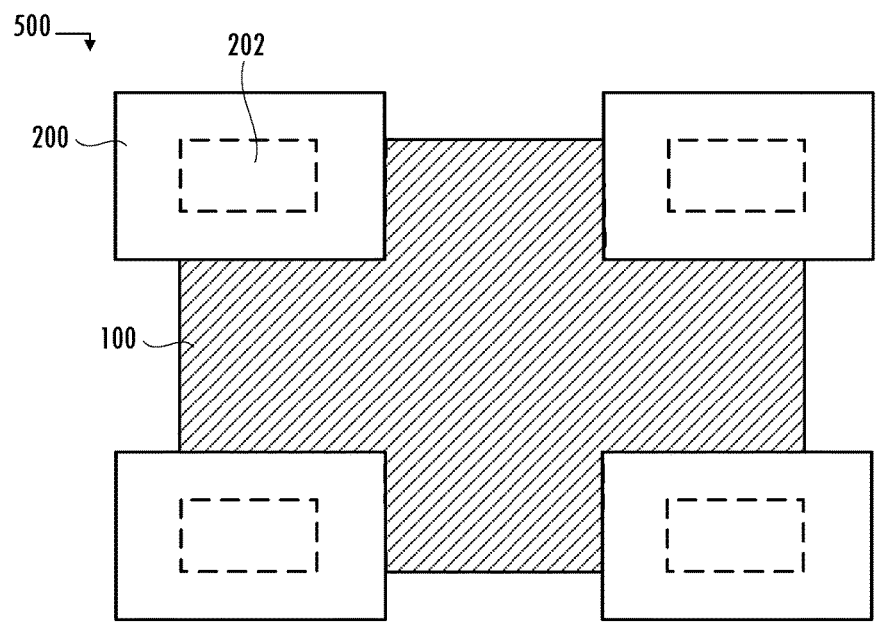
FIG. 5 illustrates a plan view of an exemplary offset-perimeter-aligned configuration for integration of the processor die and multiple memory modules in a three-dimensional integrated circuit consistent with at least one embodiment of the invention.

Referring to FIG. 5, at least one embodiment, a three-dimensional integrated circuit obtains a substantial reduction in the percentage (e.g., a reduction of 65%) of high power density regions of processor die 100 that are in contact with a high thermal resistance path. That reduction is obtained at the expense of increased lateral area of the three-dimensional integrated circuit, additional manufacturing steps, and thus, an increased cost of the three-dimensional integrated circuit. Electrical contacts 202 of memory modules 200 and corresponding contacts of processor die 100 are aligned with the perimeter of processor die 100. As a result, portions of memory modules 200 overhang processor die 100, i.e., portions of memory module 200 extend beyond the periphery of processor die 100, and portions of memory module 200 are stacked within the periphery of processor die 100. Thus, the area of three-dimensional integrated circuit 500 is greater than (e.g., approximately 50% greater than) the area of three-dimensional integrated circuit 300 and three-dimensional integrated circuit 400 of FIG. 3 and FIG. 4, respectively. Like three-dimensional integrated circuit 300 and three-dimensional integrated circuit 400, three-dimensional integrated circuit 500 of FIG. 5 includes underfill material that fills in gaps between adjacent memory modules 200 and between memory modules 200 and processor die 100. Mold material encapsulates portions of the stack. The sizes of the overhang portions are limited by the size and location of electrical contacts 202, which may be coupled to through-silicon vias of processor die 100.

Figure 6:
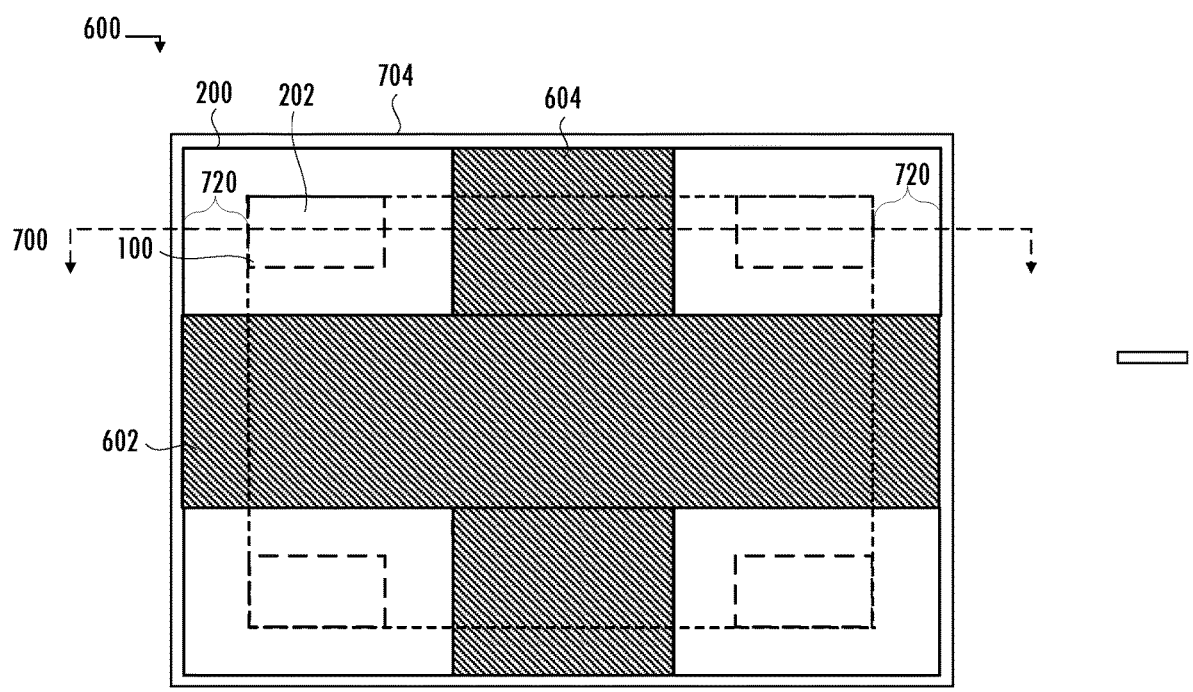
FIG. 6 illustrates a plan view of the offset-perimeter-aligned configuration of FIG. 5 of a three-dimensional integrated circuit including filler material and mold material consistent with at least one embodiment of the invention.

Referring to FIG. 6, as discussed above, the high power density regions of processor die 100 reside in particular portions of processor die 100 (e.g., toward the center of processor die 100). Memory module 200 has a higher thermal resistance than a single silicon filler die or other filler material. Accordingly, offsetting memory module 200 with respect to processor die 100 in a three-dimensional integrated circuit structure provides space to position a lower thermal resistance path structure directly on top of a region of processor die 100 having a higher power density. In at least one embodiment of a three-dimensional integrated circuit having perimeter-aligned contacts and an offset-perimeter-aligned stacked die configuration, lanes between memory modules 200 are filled with a homogeneous inorganic material (e.g., silicon crystal). For example, filler silicon portion 602 and filler silicon portion 604 are attached in the lanes between memory modules 200. Filler silicon portion 602 and filler silicon portion 604 may extend between multiple memory modules 200, extend across a wafer including multiple processor die 100, and may be shared with other processor die on a wafer adjacent to processor die 100 on the wafer.

Figure 7:
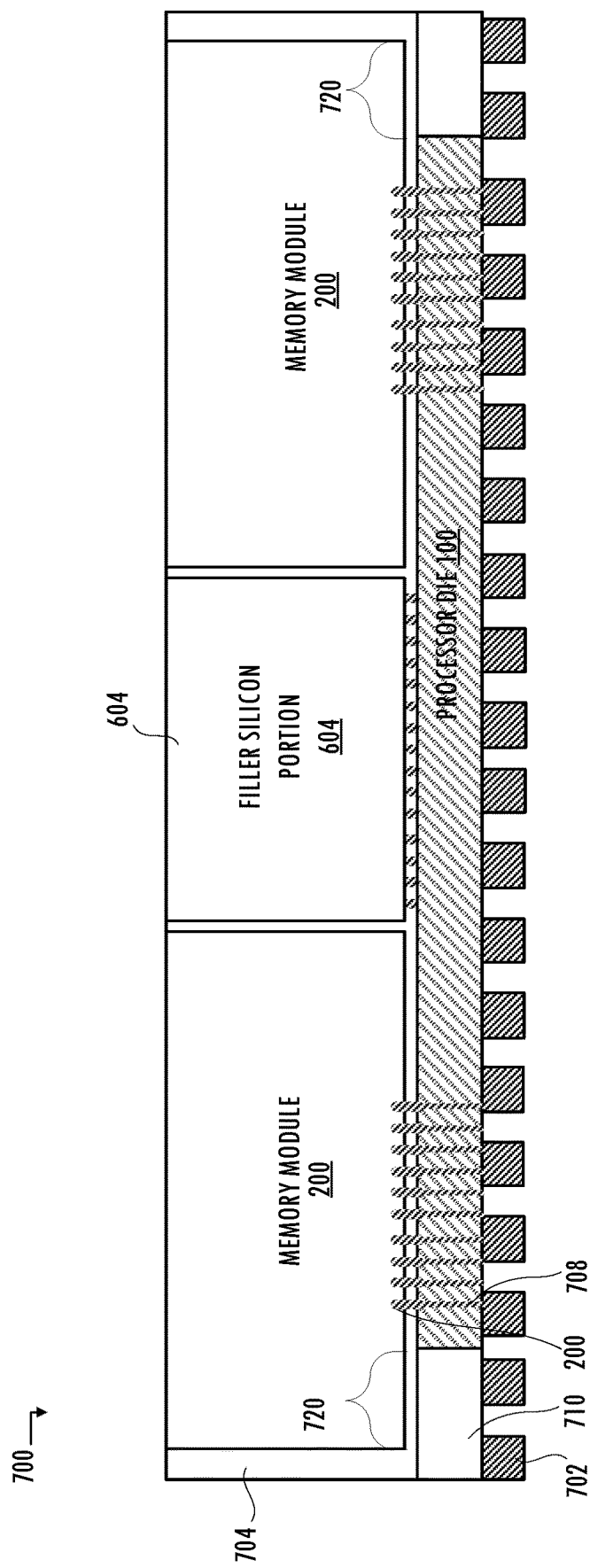
FIG. 7 illustrates a cross-sectional view of an exemplary the offset-perimeter-aligned configuration of the three-dimensional integrated circuit of FIG. 6 consistent with at least one embodiment of the invention.

Referring to FIGS. 6 and 7, in an exemplary embodiment of a three-dimensional integrated circuit having perimeter-aligned contacts and offset-perimeter-aligned stacked die configuration, memory modules 200 are stacked on a backside of processor die 100 and disposed laterally with respect to each other, to form overhang portions 720. Overhang portions 720 of the memory modules extend beyond the periphery of processor die 100 and portions of the memory modules are stacked within the periphery of processor die 100. Electrical contacts 202 are electrically and mechanically coupled to through-silicon vias 708, which are coupled to frontside conductors 702 (e.g., conductive pads, conductive bumps, or conductive pillars) of processor die 100.

Mold material 704 encapsulates portions of the stacked die. Material 710 is an encapsulant (e.g., silicon oxide or organic mold) that fills in gaps that extend from the periphery of processor die 100 underneath the overhanging portions of the memory modules. In an embodiment including four memory modules, each memory module 200 is stacked on processor die 100 at a corresponding corner of processor die 100. In embodiment of a three-dimensional integrated circuit including other numbers of memory modules, and each memory module 200 is stacked on processor die 100 and disposed laterally from any other memory module 200 with respect to the surface of processor die 100.

Figure 8:
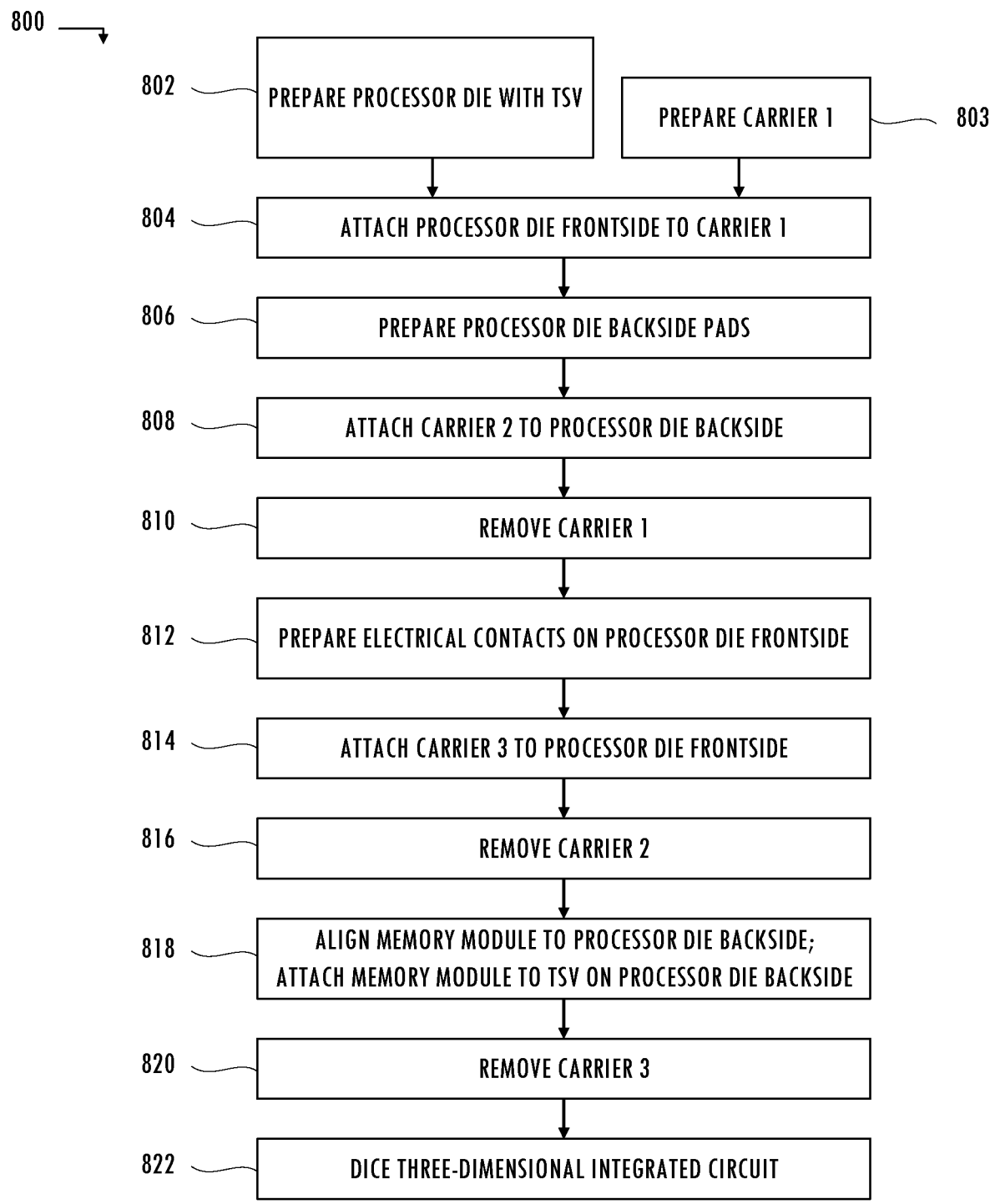
FIG. 8 illustrates an exemplary manufacturing process flow for the offset-perimeter-aligned configuration of the three-dimensional integrated circuit of FIG. 6 consistent with at least one embodiment of the invention.

Referring to FIGS. 7 and 8, in at least one embodiment, a three-dimensional integrated circuit with perimeter-aligned contacts and offset-perimeter-aligned stacked die configuration is formed using manufacturing process 800. Processor die 100 may be manufactured using conventional semiconductor wafer processing, diced, and reconstituted on another wafer to widen scribe lanes between processor die 100 to accommodate the larger area of three-dimensional integrated circuit 700. Reconstitution may be preceded by testing of processor die 100 and only qualified die are reconstituted on the other wafer for further processing. In other embodiments, processor die 100 are manufactured using conventional semiconductor wafer manufacturing processes on a wafer with scribe lanes wide enough to accommodate the larger area of three-dimensional integrated circuit 700, thus eliminating the need to dice and reconstitute on another wafer.

Manufacturing process 800 includes preparing processor die 100 to have through-silicon vias in a region where a redistribution layer will be present between processor die 100 and a memory module or in a region that corresponds to electrical contacts of a memory module (802). Through-silicon vias 708 are vertical interconnect structures that pass completely thorough processor die 100. For example, through-silicon vias 708 are formed using wafer backside lithography, deep silicon etching, silicon dioxide etching (e.g., reactive ion etch (RIE)) with a photoresist mask, side wall insulation deposition (e.g., low-temperature plasma-enhanced chemical vapor deposition (PECVD), silicon dioxide deposition, and subsequent silicon dioxide RIE), and conductive material processing. Manufacturing process 800 includes preparing a first carrier wafer (e.g., preparing a native oxide layer surface, pre-bonding at room temperature, and annealing at elevated temperature) (803). In general, carrier wafers (e.g., glass wafer or silica wafer) provide structural support and permit safe handling of delicate semiconductor wafers during manufacturing. Manufacturing process 800 attaches the frontside of processor die 100 to the first carrier wafer using direct bonding or using a temporary bonding adhesive (e.g., a material including low temperature wax, hydrocarbon oligomers or polymers, acrylate, epoxy, silicone, or high temperature thermoplastic). The attachment of the first carrier wafer may be followed by planarization (e.g., using a silicon oxide material or mold compound) and wafer thinning (e.g., by back grinding and polishing techniques) to reveal through-silicon vias on the backside of processor die 100 (804).

Next, manufacturing process 800 prepares backside pads, or other electrical connectors on processor die 100 by forming one or more conductive layers (e.g., redistribution layers) and photoresist masking techniques. For example, a photoresist is applied, a reticle including a backside pad pattern is used to selectively expose the photoresist material, and unwanted material is removed (e.g., etched away). Instead of a subtractive patterning process, an additive patterning process may be used to form conductive structures only in regions that need the material (806). A second carrier wafer is attached to the backside of processor die 100 using direct bonding or a temporary bonding adhesive (808) and the first carrier wafer is removed using a mechanism associated with the corresponding bonding technique, e.g., mechanical separation, ultra-violet curing and release, heat curing and release, thermal sliding, chemical activation, laser activation, or other debonding technique associated with the material of the temporary bonding adhesive (810). Following the removal of the first carrier wafer, electrical contacts are formed on the frontside of processor die 100 by applying a conductive layer and using photoresist masking techniques (812).

After the formation of frontside electrical contacts, a third carrier wafer is attached to the frontside of processor 100 using direct bonding or a temporary bonding adhesive (814) and the second carrier wafer is removed using a mechanism associated with the corresponding bonding technique (816). Electrical contacts 202 of memory module 200 are aligned and attached to electrical contacts on the backside of processor die 100 (818). At this time, filler silicon portion 602 and filler silicon portion 604 are attached to the backside of processor die 100 and wafer-level molding and molded wafer back grind are performed. The third carrier wafer is removed using a debonding mechanism associated with the corresponding bonding technique (820). A wafer including the resulting three-dimensional integrated circuit is then diced to form three-dimensional integrated circuit 700 (822).

Note that manufacturing process 800 is exemplary only and other sequences and types of manufacturing steps may be used to generate a three-dimensional integrated circuit having perimeter-aligned contacts and offset-perimeter-aligned stacked die configuration. For example, rather than start with backside processing and carrier wafer attach to the frontside of processor die 100 of manufacturing process 800, processing may begin with frontside processing of processor die 100 before preparing the through-silicon vias (802). The resulting manufacturing process is a simplified version of manufacturing process 800 that uses fewer carriers and fewer steps (e.g., steps 808-816 and 820 are excluded). For example, after preparing processor die backside pads (806), electrical contacts 202 of memory module 200 are aligned and attached to electrical contacts on the backside of processor die 100 (818). At this time, filler silicon portion 602 and filler silicon portion 604 are attached to the backside of processor die 100 and wafer-level molding and molded wafer back grind are performed. The first carrier wafer is removed using a debonding mechanism associated with the corresponding bonding technique and a wafer including the resulting three-dimensional integrated circuit is then diced to form three-dimensional integrated circuit 700 (822). However, this simplification of manufacturing process 800 trades off reduced complexity and cost of manufacture with increased challenges to reconstitution of singulated die and control of the through-silicon via reveal process.

In other embodiments, a three-dimensional integrated circuit includes vertical stacks of die having different geometries (e.g., different rectangular proportions or different square proportions). Those die of different geometries may be interleaved in a stack to create or increase cavities in the three-dimensional integrated circuit, which may improve conditions for thermal management. For example, referring to FIG. 9, square die structure 1004 may be a smaller-scaled version of square die structure 1002 (e.g., the smaller die has fewer memory circuits or core circuits than the larger die) or square die structure 1002 and square die structure 1004 may be different types of die (e.g., a memory die and a controller die). The entirety of square die structure 1004 may be stacked on square die structure 1002 within the periphery of square die structure 1002, and no portions of square die structure 1004 overhang square die structure 1002. Interleaving those different die creates cavities in the die stack. In other embodiments, square die structure 1004 may be offset-perimeter aligned to square die structure 1002 to create cavities that are asymmetrically positioned in the stack of die. Although square die structure 1002 may be a single die and square die structure 1004 may be a single die, in other embodiments of a three-dimensional integrated circuit, square die structure 1002 includes a plurality of die having the same, first geometry aligned in a stack. That stacked die structure increases the size of a cavity formed by stacking square die structure 1002 and square die structure 1004. Similarly, square die structure 1004 may include a plurality of die having the same, second geometry aligned in a stack, thus increasing the size of a cavity formed by stacking square die structure 1002 and square die structure 1004. Stacking of individual die to form square die structure 1002 may occur prior to stacking with square die structure 1004. In another embodiment, square die structure 1002 may be formed by stacking a first square die with the first geometry in a stack with square die structure 1004 and then stacking at least one additional square die with the first geometry aligned with the first square die.

Figure 10:
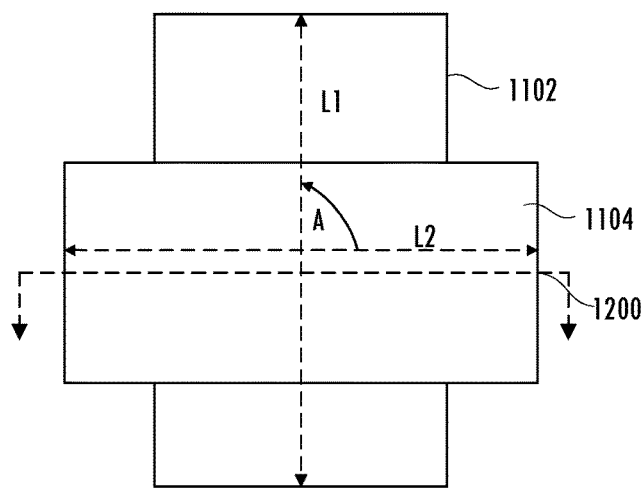
FIG. 10 illustrates a plan view of an exemplary configuration for stacking integrated circuit die having the same rectangular geometry in a three-dimensional integrated circuit consistent with at least one embodiment of the invention.

Referring to FIG. 10, in some embodiments of a three-dimensional integrated circuit, each individual integrated circuit die has a rectangular geometry that may be used to create or increase the size of cavities in the three-dimensional integrated circuit. Rather than align the length and width of rectangular die structure 1102 and rectangular die structure 1104, rectangular die structure 1102 and rectangular die structure 1104 are positioned in a stack with their length dimensions L1 and L2, respectively, orthogonal to each other. Offsetting the alignment of the length dimensions of those die at an angle A greater than zero (e.g., 0<∠A≤90 degrees) creates cavities that may improve conditions for thermal management at the expense of increased size and manufacturing process steps of the three-dimensional integrated circuit. Although rectangular die structure 1102 may be a single die and rectangular die structure 1104 may be a single die, in other embodiments of a three-dimensional integrated circuit, rectangular die structure 1102 includes a plurality of die having the same, first geometry aligned in a stack. That stacked structure increases the size of a cavity formed by stacking rectangular die structure 1102 and rectangular die structure 1104. Similarly, rectangular die structure 1104 may include a plurality of die having the same, second geometry aligned in a stack, thus increasing the size of a cavity formed by stacking rectangular die structure 1102 and rectangular die structure 1104. Stacking of individual die to form rectangular die structure 1102 may occur prior to stacking with rectangular die structure 1104. In another embodiment, rectangular die structure 1102 may be formed by stacking a first rectangular die with the first geometry in a stack with rectangular die structure 1104 and then stacking at least one additional rectangular die with the first geometry aligned with the first rectangular die.

Figure 9:
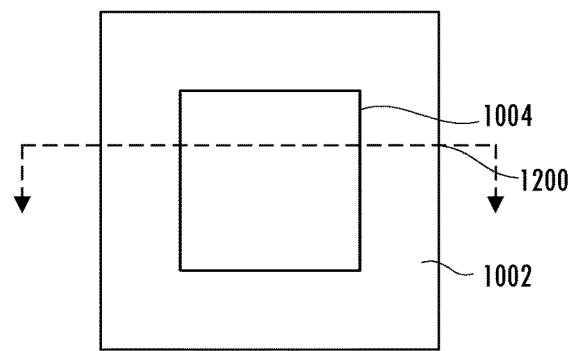
FIG. 9 illustrates a plan view of an exemplary configuration for stacking integrated circuit die having different geometries in a three-dimensional integrated circuit consistent with at least one embodiment of the invention.
Figure 11:
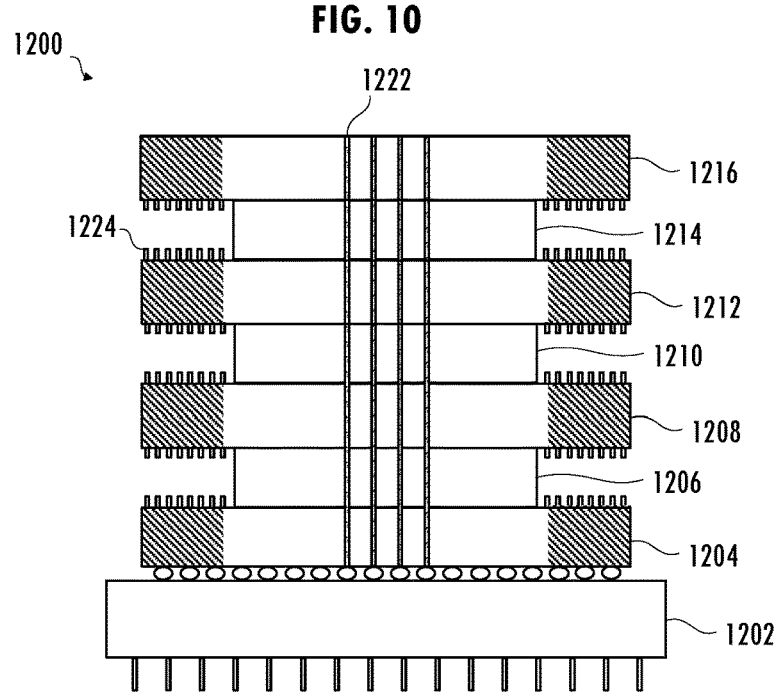
FIG. 11 illustrates a cross-sectional view of the exemplary three-dimensional integrated circuit of FIG. 9 or FIG. 10 consistent various embodiments of the invention.

Referring to FIG. 11, in some embodiments of a three-dimensional integrated circuit in which an unsupported die portion does not introduce mechanical issues, rather than use filler material, cavities in the three-dimensional structure may be used to dissipate heat, and die are placed in mechanical contact with regions of lower operational power density (e.g., unshaded regions of die 1204, die 1208, die 1212, and die 1216). Three-dimensional integrated circuit 1200 includes cavities between adjacent die of the same geometry and alignment, thereby improving conditions for thermal management. Die 1204, die 1208, die 1212, and die 1216 may be larger square die interleaved with die 1206, die 1210, and die 1214, which are smaller square die as illustrated in FIG. 9. In other embodiments of three-dimensional integrated circuit 1200, die 1204, die 1208, die 1212, and die 1216 are rectangular die having lengths oriented orthogonally to lengths of die 1206, die 1210, and die 1214, which are other rectangular die, as illustrated in FIG. 10. Note that although adjacent die of the same geometry and alignment (e.g., die 1204, die 1208, die 1212, and die 1216, which have a first geometry and alignment, or die 1206, die 1210, and die 1214, which have a second geometry and alignment) may be identical to each other, in other embodiments of a three-dimensional integrated circuit, adjacent die of the same geometry and alignment may vary from each other in other aspects.

Referring to FIG. 11, by placing power-hungry logic (shaded regions of die 1204, die 1208, die 1212, and die 1216), towards periphery of the die, near cavities of three-dimensional integrated circuit 1200, improves heat radiation towards the cavities, where the heat is dissipated. Die 1204, die 1206, die 1208, die 1210, die 1212, die 1214, and die 1216 may be homogenous die (e.g., memory die) or heterogeneous die (e.g., die having circuits of different functions) coupled to a controller die 1202 using through-silicon vias 1222. In other embodiments of three-dimensional integrated circuit 1200, through-silicon vias 1222 are perimeter-aligned, and die are offset-perimeter-aligned, creating a three-dimensional integrated circuit having asymmetrically disposed cavities.

Figure 12:
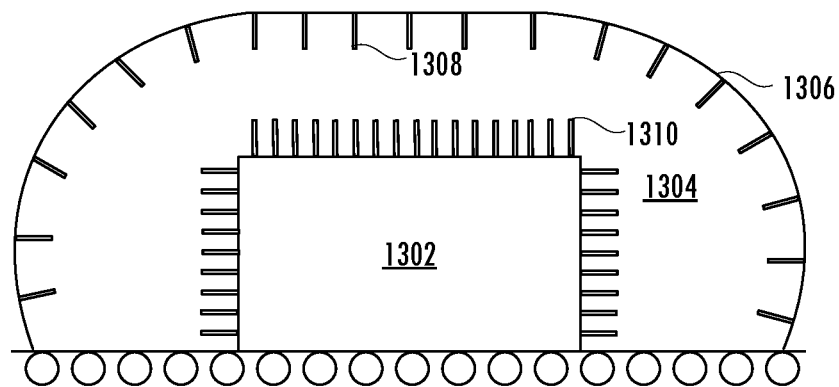
FIG. 12 illustrates a cross-sectional view of an exemplary packaged three-dimensional integrated circuit consistent with at least one embodiment of the invention.

In at least one embodiment of a three-dimensional integrated circuit, changing the surface texture of die overhang portions that extend into the cavities increases contact area with air or other heat dissipating material in the cavity. For example, deposition of structures or outgrowth of structures 1224, which may be thermally conductive carbon nanotubes (e.g., carbon nanotubes having thermal conductivity of at least approximately 6000 Watts (W) per milli-Kelvin (mK)) having micron feature size, may be used. Referring to FIG. 12, in at least one embodiment of a packaged three-dimensional integrated circuit, structures 1308 may also be deposited on package lid 1302 and on a surface of three-dimensional integrated circuit 1302 to increase heat conductivity and to reduce the thermal resistance of the interface between three-dimensional integrated circuit 1302, thermal interface material 1304 (e.g., silicone rubber or thermal grease mixed with aluminum particles and zinc oxide, gold, platinum, silver, nanofoils composed of layers of aluminum and nickel, or other base material and thermally conductive particles), and lid 1306.

Techniques for changing the surface texture of the three-dimensional integrated circuit and/or package may be incorporated with heat extraction techniques, such as thermal interface material interfaces that are deposited on die before stacking or injected into cavities after stacking. After stacking die, thermal interface material sidewalls may be formed and bonded to sides of the package. The three-dimensional integrated circuit may have an interface with a heat spreader, which may be air-cooled or liquid-cooled. An exemplary thermal interface material has a higher thermal conductivity as compared to silicon (e.g., 149 W/mk). For example, copper has a thermal conductivity of 385 W/(mK) and graphene films have a thermal conductivity of 1219 W/(mK). Other heat dissipating techniques may be used (e.g., pumping liquid coolant in and out of the package, microfluidic-based closed loop in-package cooling, electro-hydrodynamic ionic wind solutions).

Figure 13:
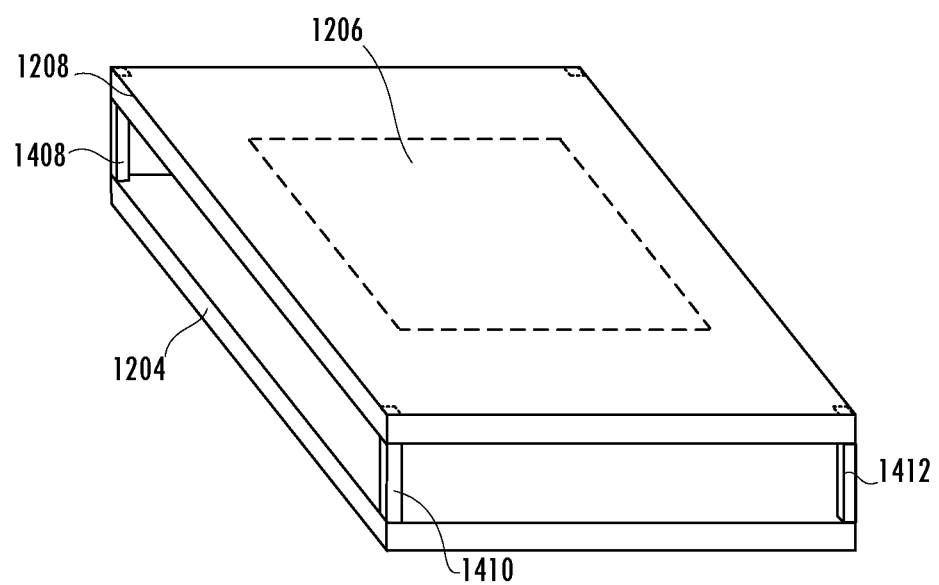
FIG. 13 illustrates a perspective view of an exemplary three-dimensional integrated circuit including support structures consistent with at least one embodiment of the invention.

Referring to FIGS. 11 and 13, the three-dimensional integrated circuit may include support structures to reduce the likelihood of damage to overhang portions of integrated circuit die structures from mechanical issues. For example, support structures disposed at or near the corners (e.g., support structure 1408, support structure 1410, and support structure 1412) are formed on integrated circuit die structure 1204 before attaching integrated circuit die structure 1208 to integrated circuit die structure 1206. The support structures do not substantially reduce the cavity. Exemplary support structures are formed from silicon or thermal interface material (TIM).

Thus, techniques for improving conditions for thermal management of a three-dimensional integrated circuit have been disclosed. The techniques include offset alignment and placement of die a stack to increase power dissipation. The description of the invention set forth herein is illustrative and is not intended to limit the scope of the invention as set forth in the following claims. For example, while the invention has been described in an embodiment in which a processor die is positioned on the bottom of a three-dimensional integrated circuit structure with four memory modules positioned laterally on the backside of a processer die, each memory module including multiple stacked memory die, one of skill in the art will appreciate that the teachings herein can be utilized with any number of integrated circuit die, heterogenous mixing of integrated circuit die, die of varying geometry, and various other stacking configurations. Variations and modifications of the embodiments disclosed herein, may be made based on the description set forth herein, without departing from the scope of the invention as set forth in the following claims.

What is claimed is:

1. A three-dimensional integrated circuit comprising:
a first die structure having a first geometry, the first die structure comprising:
a first region that operates with a first power density; and
a second region that operates with a second power density, the first power density being less than the second power density; and
a second die structure having a second geometry, a stacked portion of the second die structure being aligned with the first region,
wherein an overhang portion of the first die structure extends beyond a periphery of the second die structure, and
wherein the first die structure includes a first thermally-conductive carbon nanotube on a top surface of the overhang portion and includes a second thermally-conductive carbon nanotube on a bottom surface of the overhang portion.

2. The three-dimensional integrated circuit as recited in claim 1 further comprising:
an additional die structure stacked with the first die structure and the second die structure,
wherein the additional die structure has the first geometry and the three-dimensional integrated circuit further comprises:
a cavity between the first die structure and the additional die structure,
wherein at least a portion of the second region is in contact with the cavity.

3. The three-dimensional integrated circuit as recited in claim 1 further comprising:
an additional die structure stacked with the first die structure and the second die structure,
wherein the additional die structure has the first geometry and the second die structure in its entirety is stacked between the first die structure and the additional die structure.

4. The three-dimensional integrated circuit as recited in claim 1 wherein the second region is located at a second periphery of the first die structure and the stacked portion of the second die structure is stacked on the first region.

5. The three-dimensional integrated circuit as recited in claim 1 wherein the first thermally-conductive carbon nanotube and the second thermally-conductive carbon nanotube increase a contact area of the three-dimensional integrated circuit and a heat dissipating material.

6. The three-dimensional integrated circuit as recited in claim 1 wherein the first geometry is rectangular and is the same as the second geometry and the first die structure is oriented at an angle with respect to the second die structure.

7. The three-dimensional integrated circuit as recited in claim 1 wherein the first die structure or the second die structure comprises a plurality of die having the same geometry aligned in a stack.

8. The three-dimensional integrated circuit as recited in claim 1 wherein the first die structure comprises a graphics processing unit and the second die structure comprises a stacked memory module.

9. The three-dimensional integrated circuit as recited in claim 1 further comprising a package including a structure on an interior surface of the package, the structure increasing a contact area of the package and a heat dissipating material.

10. The three-dimensional integrated circuit as recited in claim 9 wherein the structure includes a third thermally-conductive carbon nanotube.

11. The three-dimensional integrated circuit as recited in claim 1 further comprising a support structure disposed at or near a corner of the first die structure.

12. The three-dimensional integrated circuit as recited in claim 11 wherein the support structure is formed from silicon or thermal interface material.

13. The three-dimensional integrated circuit as recited in claim 11 further comprising at least one additional support structure disposed at or near another corner of the first die structure.

14. The three-dimensional integrated circuit as recited in claim 11 further comprising a thermal interface material sidewall attached to a side of a package.

15. The three-dimensional integrated circuit as recited in claim 1 further comprising:
an additional die structure stacked with the first die structure and the second die structure, the additional die structure having the first geometry or the second geometry,
wherein the first thermally-conductive carbon nanotube and the second thermally-conductive carbon nanotube extend into cavities between adjacent die of the same geometry and alignment.

16. The three-dimensional integrated circuit as recited in claim 9 wherein additional thermally-conductive nanotubes extend from a surface of the package and into a cavity between the package and a die stack including the first die structure and the second die structure.

17. The three-dimensional integrated circuit as recited in claim 16 wherein the cavity is filled with air.

18. The three-dimensional integrated circuit as recited in claim 16 wherein the cavity is filled with a thermal interface material.

19. The three-dimensional integrated circuit as recited in claim 1 further comprising:
   an additional die structure stacked with the first die structure and the second die structure, the additional die structure having the first geometry or the second geometry,
   wherein the additional die structure includes a third thermally-conductive carbon nanotube on a second top surface or a second bottom surface of a second overhang portion of the additional die structure and includes no thermally-conductive carbon nanotubes on the other surface of the top surface or the bottom surface of the overhang portion of the additional die structure.

20. The three-dimensional integrated circuit as recited in claim 1 wherein a second stacked portion of the first die structure does not include thermally-conductive carbon nanotubes.

* * * * *